(12) United States Patent
Liu et al.

(10) Patent No.: US 7,459,783 B2
(45) Date of Patent: Dec. 2, 2008

(54) LIGHT EMITTING CHIP PACKAGE AND LIGHT SOURCE MODULE

(75) Inventors: Men-Shew Liu, Tainan County (TW); Yu-Tang Pan, Tainan County (TW)

(73) Assignee: ChipMOS Technologies Inc., Hsinchu (TW)

(*) Notice: Subject to any disclaimer, the term of this patent is extended or adjusted under 35 U.S.C. 154(b) by 49 days.

(21) Appl. No.: 11/746,063

(22) Filed: May 9, 2007

(65) Prior Publication Data

US 2008/0135869 A1 Jun. 12, 2008

(30) Foreign Application Priority Data

Dec. 6, 2006 (TW) ............................... 95145368 A

(51) Int. Cl.
*H01L 33/00* (2006.01)
(52) U.S. Cl. .................. 257/707; 257/678; 257/99; 257/E33.058
(58) Field of Classification Search .................. 257/79, 257/99, 707, 710, 719, E33.058
See application file for complete search history.

(56) References Cited

U.S. PATENT DOCUMENTS

| | | | | |
|---|---|---|---|---|
| 7,230,279 | B2* | 6/2007 | Kuo et al. | 257/81 |
| 2004/0222433 | A1* | 11/2004 | Mazzochette et al. | 257/99 |
| 2005/0233485 | A1* | 10/2005 | Shishov et al. | 438/25 |
| 2006/0220036 | A1* | 10/2006 | Lee et al. | 257/81 |

* cited by examiner

*Primary Examiner*—Evan Pert
*Assistant Examiner*—William Harriston
(74) *Attorney, Agent, or Firm*—Jianq Chyun IP Office

(57) ABSTRACT

A light emitting chip package having a carrier, at least one light emitting chip and a thermal enhanced cover is provided. The carrier includes a plurality of through holes. The light emitting chip is disposed on the carrier. The light emitting chip has an active surface, a back surface opposite to the active surface and a plurality of bumps disposed on the active surface. The light emitting chip is electrically connected to the carrier through the bumps. The thermal enhanced cover is disposed on the carrier to expose at least one side of the light emitting chip. The thermal enhanced cover includes a cover body and a plurality of protrusions connected thereto. A portion of the cover body is above the back surface of the light emitting chip. The protrusions are respectively inserted through the through holes. Therefore, the thermal dissipation efficiency of the light emitting chip package is improved.

20 Claims, 3 Drawing Sheets

LIGHT EMITTING CHIP PACKAGE AND LIGHT SOURCE MODULE

CROSS-REFERENCE TO RELATED APPLICATION

This application claims the priority benefit of Taiwan application serial. no. 95145368,filed Dec. 6, 2006. All disclosure of the Taiwan application is incorporated herein by reference.

BACKGROUND OF THE INVENTION

1. Field of the Invention

The present invention relates to a light source module and a chip package, and more particularly, the present invention relates to a backlight module and a light emitting chip package.

2. Description of Related Art

Recently, light emitting diode (LED) devices that use semiconductors containing gallium nitride compounds such as GaN, AlGaN, InGaN are gaining popularity. The Group III nitride is a material with wide band gap and its light wavelength ranges from ultraviolet light to red light. In other words, the range covers almost the entire visible light spectrum. Further, in comparison to conventional light bulbs, light emitting diodes are characterized as compact, long lasting, driven by low voltage/current, durable, mercury free (no pollution problem) and offer good light emitting efficiency (power saving) etc. Hence, LEDs are used very extensively in the industry.

Since the light emitted from the light emitting diode is a type of cold emission but not thermal emission nor electric discharge, the life time of a light emitting diode device often exceeds a hundred thousand hours. Furthermore, light emitting diodes do not require idling time. In addition, light emitting diode devices have fast response time (about $10^{-9}$ seconds), small volume, low power consumption, low pollution (mercury free), high reliability, and the manufacturing process is suitable for mass production. As a result, the application of LED is broad. Hence, light emitting diodes are considered the most important light source in the $21^{st}$ century.

Nevertheless, light emitting diodes generate a large amount of heat during operation and the brightness and life time of the light emitting diodes are affected by temperature. Therefore, as the power of light emitting diodes increases, the need to dissipate heat increases. The conventional art utilizes a complex heat dissipation system. However, utilizing a complex heat dissipation system will result in an oversized device and an increase in the manufacturing costs.

SUMMARY OF THE INVENTION

The present invention is directed to a light source module with longer life time.

The present invention is directed to a light emitting package chip with high thermal dissipation efficiency.

The present invention is directed to a light emitting chip package that includes a carrier, at least one light emitting chip and a thermal enhanced cover. Herein, the thermal enhanced cover includes a plurality of through holes. The light emitting chip is disposed on the carrier. The light emitting chip has an active surface, a back surface opposite the active surface and a plurality of bumps. Herein, the bumps are disposed on the active surface and the light emitting chip is electrically connected to the carrier through the bumps. The thermal enhanced cover is disposed on the carrier and exposes at least one side of the light emitting chip. The thermal enhanced cover includes a cover body and a plurality of protrusions. Herein, the protrusions and the cover body are connected. Further, a portion of the cover body is above the back surface of the light emitting chip package and the protrusions are inserted through the through holes.

In one embodiment of the present invention, the cover body includes a top and a plurality of sidewalls. Herein, the top is disposed on the back surface of the light emitting chip and the sidewalls are connected to the top. Further, each protrusion is connected to one of the sidewalls.

In one embodiment of the present invention, the light emitting chip package further includes a first paste that is disposed between the top and the light emitting chip.

In one embodiment of the present invention, the first paste can be heat dissipation paste or B-stage adhesive.

In one embodiment of the present invention, the light emitting chip package further includes a second paste that is disposed between the sidewalls and the carrier.

In one embodiment of the present invention, the second paste can be heat dissipation paste, non-conductive paste or B-stage adhesive.

In one embodiment of the present invention, the shape of the cover body includes a hemisphere.

In one embodiment of the present invention, the light emitting chip package further includes an underfill that is disposed between the light emitting chip and the carrier to cover the bumps. Further, the underfill exposes the back surface of the chip.

In one embodiment of the present invention, the carrier includes a first patterned metal layer, a second patterned metal layer, a solder mask layer and a plurality of conductive through holes. Herein, the first patterned metal layer and the second patterned metal layer are respectively disposed on the opposing surfaces of the carrier. Further, a portion of the first patterned metal layer is covered by the solder mask layer. In addition, the first patterned metal layer and the second patterned metal layer are electrically connected through the conductive through holes. The bumps and the first patterned metal layer are electrically connected.

In one embodiment of the present invention, the light emitting chip package includes a light emitting diode or an organic light emitting diode.

The present invention is directed to a light source module that includes a first carrier and at least one light emitting chip package. The first carrier includes a metal substrate and a third patterned metal layer. Herein, the third patterned metal layer is disposed on the metal substrate. The light emitting chip package is disposed on the first carrier and is electrically connected to the third patterned metal layer. The light emitting chip package includes a second carrier, at least one light emitting chip and a thermal enhanced cover. Herein, the second carrier includes a plurality of through holes. Further, the light emitting chip is disposed on the second carrier and electrically connected to the second carrier. The light emitting chip has an active surface, a back surface opposite the active surface and a plurality of bumps. Herein, the bumps are disposed on the active surface and the light emitting chip is electrically connected to the second carrier through the bumps. The thermal enhanced cover is disposed on the second carrier and exposes at least one side of the light emitting chip. The thermal enhanced cover includes a cover body and a plurality of protrusions. Herein, the protrusions are connected to the cover body. Further, a portion of the cover body is above the back surface of the light emitting chip. In addition, the protrusions are inserted into the through holes and connected to the trench.

In one embodiment of the present invention, the cover body includes a top and a plurality of sidewalls. Herein, the top is disposed on the light emitting chip and the sidewalls are connected to the top. Further, each protrusion is connected to one of the sidewalls.

In one embodiment of the present invention, the light emitting chip package further includes a first paste that is disposed between the top and the light emitting chip.

In one embodiment of the present invention, the first paste can be heat dissipation paste or B-stage adhesive.

In one embodiment of the present invention, the light emitting chip package further includes a second paste that is disposed between the sidewalls and the carrier.

In one embodiment of the present invention, the second paste can be heat dissipation paste, non-conductive paste or B-stage adhesive.

In one embodiment of the present invention, the shape of the cover body includes a hemisphere.

In one embodiment of the present invention, the light emitting chip package further includes an underfill that is disposed between the light emitting chip and the carrier to cover the bumps. Herein, the bumps are disposed on the active surface. Further, the underfill exposes the back surface of the chip.

In one embodiment of the present invention, the carrier includes a first patterned metal layer, a second patterned metal layer, a solder mask layer and a plurality of conductive through holes. Herein the first patterned metal layer and the second patterned metal layer are respectively disposed on the opposing surfaces of the carrier. Further, the solder mask layer covers a portion of the first patterned metal layer. In addition, the first patterned metal layer and the second patterned metal layer are electrically connected through the conductive through holes. The bumps and the first patterned metal layer are electrically.

In one embodiment of the present invention, the light emitting chip package includes a light emitting diode or an organic light emitting diode.

In view of the above, according to the present invention, the protrusions of the thermal enhanced cover are inserted through the through holes of the carrier. Hence, the heat generated by the light emitting chip can be conducted to the other surface of the carrier through the thermal enhanced cover to enhance the thermal dissipation efficiency. Further, each protrusion of the thermal enhanced cover in the light emitting chip package is further connected to a trench in a metal substrate. Hence, the heat generated by the light emitting chip can be conducted to the metal substrate through the thermal enhanced cover to enhance the thermal dissipation efficiency.

In order to the make the aforementioned and other objects, features and advantages of the present invention more comprehensible, preferred embodiments accompanied with figures are described in detail below.

DESCRIPTION OF EMBODIMENTS

Figure 1A:
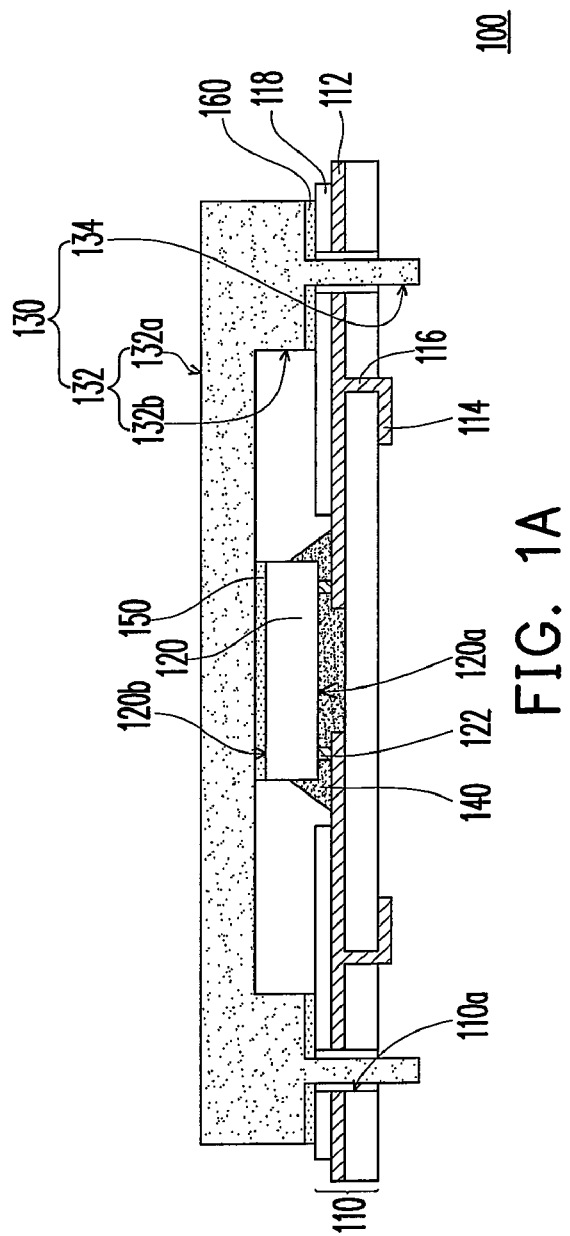
FIG. 1A is a schematic cross-sectional view illustrating a light emitting chip package according to one embodiment of the present invention.
Figure 1B:
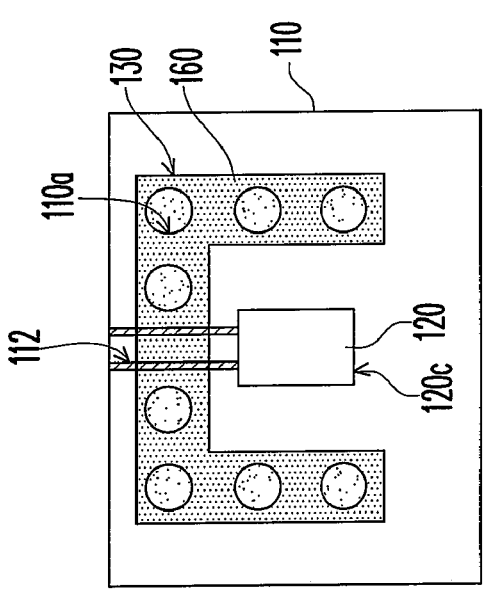
FIG. 1B is a schematic top view illustrating the light emitting chip package of FIG. 1A with some components omitted.
Figure 1C:
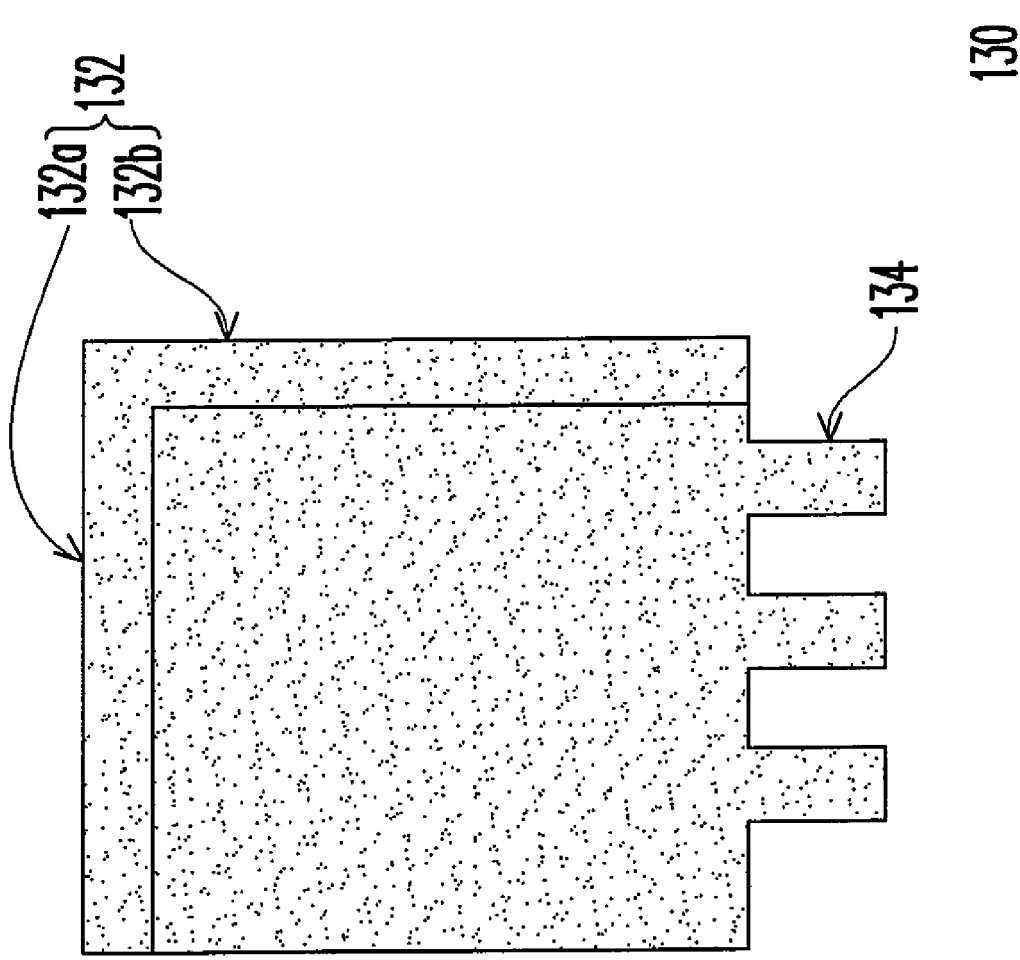
FIG. 1C is a schematic cross-sectional view illustrating the thermal enhanced cover of the light emitting chip package of FIG. 1A.

FIG. 1A is a schematic cross-sectional view illustrating a light emitting chip package according to one embodiment of the present invention and FIG. 1B is a schematic top view illustrating the light emitting chip package of FIG. 1A with some components omitted. FIG. 1C is a schematic cross-sectional view illustrating the thermal enhanced cover of the light emitting chip package of FIG. 1A. Please refer to FIG. 1A and FIG. 1B. In the present embodiment, a light emitting chip package 100 includes a carrier 110, at least one light emitting chip 120 and a thermal enhanced cover 130. Herein, the carrier 110 includes a plurality of through holes 110a and the light emitting chip 120 is disposed on the carrier 110. The light emitting chip 120 has an active surface 120a, a back surface 120b opposite the active surface 120a, and a plurality of bumps 122. The bumps 122 are disposed on the active surface 120a of the light emitting chip 120. Further, the light emitting chip 120 is electrically connected to the carrier 110 through the bumps 122. The thermal enhanced cover 130 is disposed on the carrier 110 and exposes at least one side 120c of the light emitting chip 120. The thermal enhanced cover 130 includes a cover body 132 and a plurality of protrusions 134. Herein, the protrusions 134 and the cover body 132 are connected. Further, a portion of the cover body 132 is above the back surface 120b of the light emitting chip 120 and the protrusions 134 are inserted through the through holes 110a.

In FIG. 1A and FIG. 1B, the carrier 110 can be a printed circuit board, a flexible printed circuit board or other type of circuit board. In the present embodiment, the carrier 110 includes a first patterned metal layer 112, a second patterned metal layer 114, a solder mask layer 118, and a plurality of conductive through holes 116. Herein, the first patterned metal layer 112 and the second patterned metal layer 114 are respectively disposed on the opposing surfaces of the carrier 110. Further, the first patterned metal layer 112 and the second patterned metal layer 114 are electrically connected through the conductive through holes 116. In addition, a portion of the first patterned metal layer 112 is covered by the solder mask layer 118. Moreover, the bumps 122 and the first patterned metal layer 112 are electrically connected. Furthermore, the light emitting chip 120 can be a light emitting diode or an organic light emitting diode. It should be noted that the light emitting chip package 100 in the present embodiment includes only one single light emitting chip 120. Nonetheless, in another embodiment, the light emitting chip package 100 can includes a plurality of light emitting chips 120.

Please refer to FIG. 1B and FIG. 1C, the thermal enhanced cover 130 includes a cover body 132 and a plurality of protrusions 134. Further, the protrusions 134 and the cover body 132 are connected. In the present embodiment, the shape of the cover body 132 is a rectangle. However, in another embodiment, the shape of the cover body 132 can also be a hemisphere or other shape to facilitate reflection of light. In addition, to improve the ability of the thermal enhanced cover 130 to reflect lights, a reflection material layer (not shown) can be formed on the inner surface of the cover body 132 and the material used for fabricating the reflection material layer is, for example, aluminum. In the present embodiment, the cover body 132 includes a top 132a and a plurality of sidewalls 132b. Herein, the sidewalls 132b and the top 132a are connected. Further, the top 132a is disposed on the back surface 120b of the light emitting chip 120. Each protrusion 134 is connected to one of the sidewalls 132b. In addition, the material used for fabricating the thermal enhanced cover 130 can be copper or other metal with high thermal conductivity.

Please refer to FIG. 1A and FIG. 1B. To enhance the thermal dissipation efficiency, the light emitting chip package 100 can further include a first paste 150 that is disposed between the top 132a and the light emitting chip 120. Herein, the first paste 150 can be heat dissipation paste, B-stage adhesive or other non-conductive paste. Similarly, to enhance the thermal dissipation efficiency, the light emitting chip package 100 can further include a second paste 160 that is disposed between the sidewalls 132b and the carrier 110. Herein, the second paste 160 can be heat dissipation paste, B-stage adhesive or other non-conductive paste. Further, to enhance the bonding reliability between the light emitting chip 120 and the carrier 110, the light emitting chip package 100 can further include an underfill 140 that is disposed between the light emitting chip 120 and the carrier 110 to cover the bumps 122. In addition, the underfill 140 exposes the back surface 120b.

Since the protrusions 134 of the thermal enhanced cover 130 are inserted through the through holes 110a of the carrier 110, the heat generated by the light emitting chip 120 can be conducted to the other surface of the carrier 110 through the thermal enhanced cover 130 to improve the life time and the luminescence efficiency of the light emitting chip 120. Further, the thermal enhanced cover 130 not only enhances the thermal dissipation efficiency but also acts as a reflection cover to reflect the light emitted by the light emitting chip 120. In other words, the light emitting chip package 100 not only has better thermal dissipation, but also acts as a point light source used in a side type back light module. Further, the light emitting chip package 100 can be used in light bars, which is described as follows.

Figure 2A:
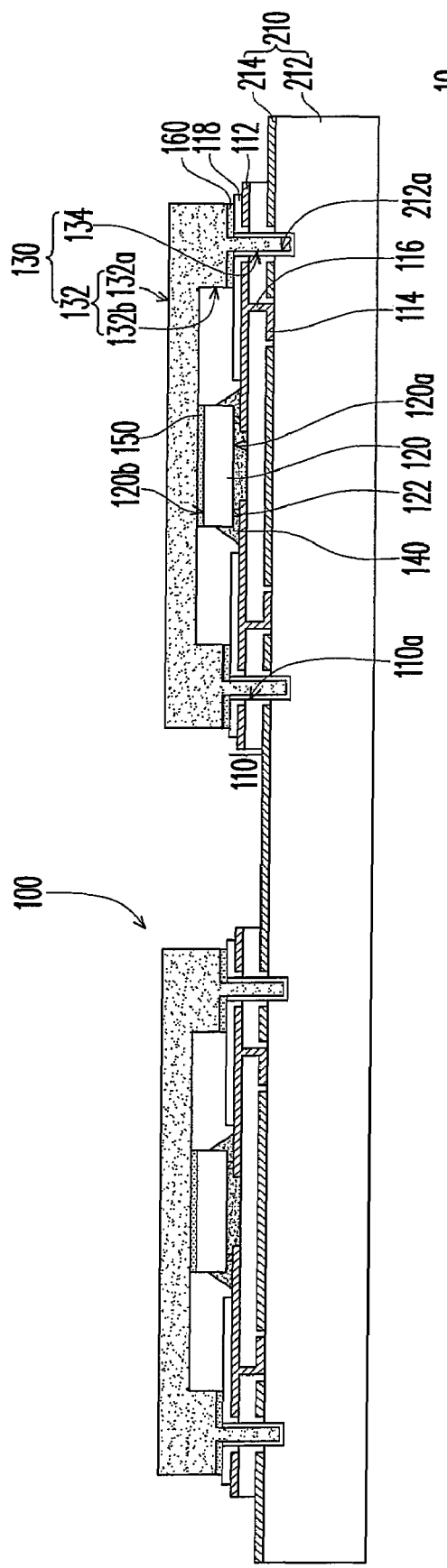
FIG. 2A is a schematic cross-sectional view illustrating a light source module according to one embodiment of the present invention.
Figure 2B:
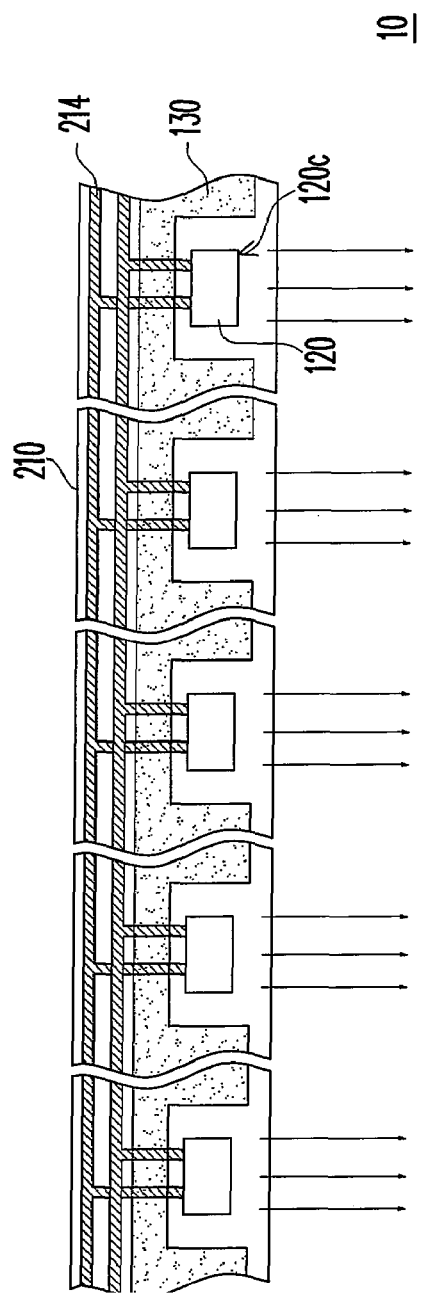
FIG. 2B is a schematic top view illustrating the light source module of FIG. 2A with some components omitted.

FIG. 2A is a schematic cross-sectional view illustrating a light source module according to one embodiment of the present invention and FIG. 2B is a schematic top view illustrating the light source module of FIG. 2A with some components omitted. Please refer to FIG. 2A and FIG. 2B. In the present embodiment, a light source module 10 includes a carrier 210 and at least one light emitting chip package 100. The carrier 210 includes a metal substrate 212 and a third patterned metal layer 214. Herein, the third patterned metal layer 214 is disposed on the metal substrate 212. Further, the metal substrate 212 has a plurality of trenches 212a. The light emitting chip package 100 is disposed on the carrier 210 and is electrically connected to the third patterned metal layer 214. For example, the light emitting chip package 100 can be electrically connected to the third patterned metal layer 214 through solder or other surface mounting technology. In addition, the detailed structure of the light emitting chip package 100 is the same as described above, which will not be described again.

Please refer to FIG. 2A and FIG. 2B. Each protrusion 134 of the thermal enhanced cover 130 in the light emitting chip package 100 is respectively connected to the trenches 212a. Hence, the heat generated by the light emitting chip 120 can be conducted to the metal substrate 212 through the thermal enhanced cover 130. In other words, the light source module 10 has better thermal dissipation efficiency and a longer life time. Further, when there is a plurality of the light emitting chip packages 100, the light emitting chip packages 100 can be electrically connected to one another through the third patterned metal layer 214 without the use of additional circuit boards to simplify design. In addition, since the light emitting chip package 100 emits light from the side (as indicated by the arrows shown in FIG. 2B), the light source module 10 utilizing this type of the light emitting chip package 100 can be used as a point light source used in a side type back light module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting chip package, comprising:
   a carrier having a plurality of through holes;
   at least one light emitting chip disposed on the carrier, wherein the light emitting chip has an active surface, a back surface opposite to the active surface and a plurality of bumps disposed on the active surface, and the light emitting chip is electrically connected to the carrier through the bumps; and
   a thermal enhanced cover disposed on the carrier that exposes at least one side of the light emitting chip, wherein the thermal enhanced cover comprises a cover body and a plurality of protrusions connected thereto, a portion of the cover body is above the back surface of the light emitting chip package, and the protrusions are inserted through the through holes.

2. The light emitting chip package of claim 1, wherein the cover body comprises a top and a plurality of the sidewalls, wherein the top is disposed on the back surface of the light emitting chip, the sidewalls and the top are connected, and each protrusion is connected to one of the sidewalls.

3. The light emitting chip package of claim 2, further comprising a first paste disposed between the top and the light emitting chip.

4. The light emitting chip package of claim 3, wherein the first paste comprises a heat dissipation paste or a B-stage adhesive.

5. The light emitting chip package of claim 2, further comprising a second paste disposed between the sidewalls and the carrier.

6. The light emitting chip package of claim 5, wherein the second paste comprises a heat dissipation paste, a non-conductive paste or a B-stage adhesive.

7. The light emitting chip package of claim 1, wherein the shape of the cover body comprises a hemisphere.

8. The light emitting chip package of claim 1, further comprising an underfill disposed between the light emitting chip and the carrier to cover the bumps and expose the back surface of the light emitting chip.

9. The light emitting chip package of claim 1, wherein the carrier comprises a first patterned metal layer, a second patterned metal layer, a solder mask layer and a plurality of conductive through holes, wherein the first patterned metal layer and the second patterned metal layer are respectively disposed on the opposing surfaces of the carrier, a portion of the first patterned metal layer is covered by the solder mask layer, the first patterned metal layer and the second patterned metal layer are electrically connected through the conductive through holes, and the bumps and the first patterned metal layer are electrically connected.

10. The light emitting chip package of claim 1, wherein the light emitting chip comprises a light emitting diode or an organic light emitting diode.

11. A light source module, comprising:
a first carrier, comprising:
   a metal substrate having a plurality of trenches;
   a third patterned metal layer disposed on the metal substrate;
at least one light emitting chip package disposed on the first carrier and electrically connected to the third patterned metal layer, wherein the light emitting chip package comprises:
   a second carrier having a plurality of through holes;
   at least one light emitting chip disposed on the second carrier, wherein the light emitting chip has an active surface, a back surface opposite the active surface and a plurality of bumps disposed on the active surface, and the light emitting chip is electrically connected to the second carrier through the bumps; and
   a thermal enhanced cover disposed on the second carrier that exposes at least one side of the light emitting chip, wherein the thermal enhanced cover comprises a cover body and a plurality of protrusions connected thereto, a portion of the cover body is above the back surface of the light emitting chip package, and the protrusions are inserted through the through holes and connected to the trenches.

12. The light source module of claim 11, wherein the cover body comprises a top and a plurality of the sidewalls, wherein the top is disposed on the back surface of the light emitting chip, the sidewalls and the top are connected, and each protrusion is connected to one of the sidewalls.

13. The light source module of claim 12, wherein the light emitting chip package further comprises a first paste disposed between the top and the light emitting chip.

14. The light source module of claim 13, wherein the first paste comprises a heat dissipation paste or a B-stage adhesive.

15. The light source module of claim 12, wherein the light emitting chip package further comprises a second paste disposed between the sidewalls and the second carrier.

16. The light source module of claim 15, wherein the second paste comprises a heat dissipation paste, non-conductive paste, or a B-stage adhesive.

17. The light source module of claim 11, wherein the shape of the cover body comprises a hemisphere.

18. The light source module of claim 11, wherein the light emitting chip package further comprises an underfill disposed between the light emitting chip and the second carrier to cover the bumps and expose the back surface of the light emitting chip.

19. The light source module of claim 11, wherein the second carrier comprises a first patterned metal layer, a second patterned metal layer, a solder mask layer and a plurality of conductive through holes, wherein the first patterned metal layer and the second patterned metal layer are respectively disposed on the opposing surfaces of the carrier, a portion of the first patterned metal layer is covered by the solder mask layer, the first patterned metal layer and the second patterned metal layer are electrically connected through the conductive through holes, and the bumps and the first patterned metal layer are electrically connected.

20. The light source module of claim 11, wherein the light emitting chip comprises a light emitting diode or an organic light emitting diode.

* * * * *